(12) United States Patent
Cheng

(10) Patent No.: US 12,419,138 B2
(45) Date of Patent: Sep. 16, 2025

(54) METHOD OF MANUFACTURING A SEMICONDUCTOR STRUCTURE, WHICH CAN BE APPLIED TO FULL-COLOR LED

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 478 days.

(21) Appl. No.: 17/925,303

(22) PCT Filed: Sep. 22, 2020

(86) PCT No.: PCT/CN2020/116789
§ 371 (c)(1),
(2) Date: Nov. 14, 2022

(87) PCT Pub. No.: WO2022/061505
PCT Pub. Date: Mar. 31, 2022

(65) Prior Publication Data
US 2023/0238474 A1    Jul. 27, 2023

(51) Int. Cl.
H10H 20/01 (2025.01)
H01L 25/075 (2006.01)
H10K 71/00 (2023.01)

(52) U.S. Cl.
CPC ..... H10H 20/0137 (2025.01); H01L 25/0753 (2013.01); H10K 71/00 (2023.02); *H10H 20/032* (2025.01)

(58) Field of Classification Search
CPC ............. H10H 20/0137; H10H 20/032; H10H 20/812; H10H 20/813; H10H 29/142;
(Continued)

(56) References Cited

U.S. PATENT DOCUMENTS 6,919,681 B2 * 7/2005 Cok ...................... H10K 59/351
313/500
8,063,552 B2 * 11/2011 Cok ........................ H05B 33/22
313/506
(Continued)

FOREIGN PATENT DOCUMENTS

CN    104064582 A    9/2014
CN    107742637 A    2/2018
(Continued)

OTHER PUBLICATIONS

State Intellectual Property Office of the People's Republic of China, Office Action and Search Report Issued in Application No. 2020801039661, Dec. 23, 2024, 13 pages.(Submitted with Machine Translation).
(Continued)

*Primary Examiner* — Maliheh Malek
(74) *Attorney, Agent, or Firm* — The Small Patent Law Group LLC; Christopher R. Carroll

(57) ABSTRACT

The present application provides a method of manufacturing a semiconductor structure. Due to different hole ratios of openings of a mask corresponding to one unit region of a substrate, flow rates of reactive gas in openings are different when growing a light emitting layer. In this way, growth rates of the light emitting layers in openings are different, and doping efficiencies of the light emitting layers in openings are different, such that composition proportions of respective elements in the grown light emitting layer are different, and the light emitting wavelengths of LEDs are different.

19 Claims, 11 Drawing Sheets

(58) Field of Classification Search
CPC ............... H10H 20/819; H10H 20/831; H01L 25/0753; H10K 71/00
See application file for complete search history.

(56) References Cited

U.S. PATENT DOCUMENTS

| | | | | |
|---|---|---|---|---|
| 8,330,352 B2* | 12/2012 | Sung | ................... | G09G 3/3208 |
| | | | | 313/506 |
| 9,324,769 B2* | 4/2016 | Guo | ................... | G09G 3/3208 |
| 9,524,669 B2* | 12/2016 | Sato | ................... | G09G 3/3233 |
| 10,818,841 B2 | 10/2020 | Gu et al. | | |
| 10,861,905 B2* | 12/2020 | Wang | ................... | G09G 3/3225 |
| 10,950,175 B1* | 3/2021 | Yang | ................... | G09G 3/2003 |
| 11,176,880 B2* | 11/2021 | Gu | ................... | G09G 3/2022 |
| 11,448,807 B2* | 9/2022 | Ji | ................... | H10K 59/353 |
| 11,903,260 B2* | 2/2024 | Bing | ................... | H10K 59/353 |
| 2005/0156515 A1* | 7/2005 | Fukase | ................ | H10K 59/352 |
| | | | | 313/504 |
| 2007/0257264 A1* | 11/2007 | Hersee | ................ | H10H 20/813 |
| | | | | 257/E33.068 |
| 2009/0121983 A1* | 5/2009 | Sung | ................... | H10K 59/352 |
| | | | | 345/76 |
| 2012/0061641 A1* | 3/2012 | Seong | ................ | H10H 29/142 |
| | | | | 438/47 |
| 2012/0068153 A1* | 3/2012 | Seong | ................ | H10H 20/817 |
| | | | | 438/47 |
| 2013/0252363 A1* | 9/2013 | Seong | ................ | H10H 20/821 |
| | | | | 438/46 |
| 2014/0209859 A1* | 7/2014 | Cha | ................... | H10H 20/818 |
| | | | | 257/13 |
| 2018/0053811 A1* | 2/2018 | Wacyk | ................ | H10K 59/353 |
| 2018/0182828 A1* | 6/2018 | Kim | ................... | H10K 59/353 |
| 2020/0161553 A1* | 5/2020 | Gu | ................... | H10K 71/40 |
| 2020/0357862 A1* | 11/2020 | Wang | ................ | C23C 14/24 |
| 2021/0271010 A1* | 9/2021 | Ji | ................... | G02F 1/1362 |
| 2021/0301386 A1* | 9/2021 | Bai | ................... | C23C 14/042 |
| 2022/0029125 A1* | 1/2022 | Liu | ................... | H10K 59/80521 |
| 2022/0123077 A1* | 4/2022 | Cui | ................... | H10K 59/122 |
| 2023/0276673 A1* | 8/2023 | Kim | ................... | H10K 71/00 |
| 2024/0237457 A1* | 7/2024 | Cao | ................... | H10K 59/353 |
| 2024/0265860 A1* | 8/2024 | Sang | ................ | G09G 3/3216 |
| 2024/0276809 A1* | 8/2024 | Xu | ................... | H10K 59/82 |
| 2024/0298493 A1* | 9/2024 | Wang | ................ | H10K 71/166 |

FOREIGN PATENT DOCUMENTS

| | | |
|---|---|---|
| CN | 107871774 A | 4/2018 |
| CN | 108807487 A | 11/2018 |
| CN | 108922988 A | 11/2018 |
| CN | 111312867 A | 6/2020 |
| JP | H07142746 A | 6/1995 |
| JP | H11330548 A | 11/1999 |
| JP | 2003158296 A | 5/2003 |
| TW | 201601340 A | 1/2016 |
| TW | 201937717 A | 9/2019 |

OTHER PUBLICATIONS

ISA State Intellectual Property Office of the People's Republic of China, International Search Report Issued in Application No. PCT/CN2020/116789, Jun. 30, 2021, WIPO, 4 pages.

ISA State Intellectual Property Office of the People's Republic of China, Written Opinion of the International Searching Authority Issued in Application No. PCT/CN2020/116789, Jun. 30, 2021, WIPO, 4 pages. (Submitted with Machine/ Partial Translation).

TW Patent Office, Office Action Issued in Application No. 110134795, Sep. 14, 2022, 5 pages. (Submitted with Machine/Partial Translation).

* cited by examiner

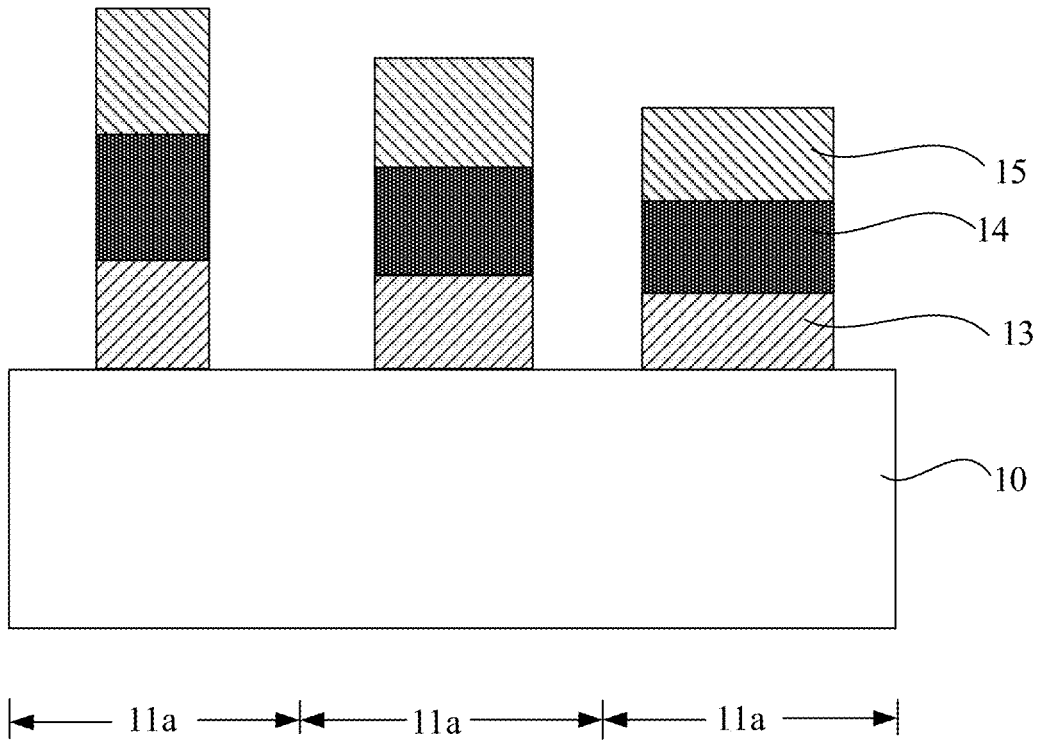

FIG. 10

| Provide a substrate, where a surface of the substrate includes unit regions, each of the unit region includes n number of sub-unit regions, and n is a positive integer greater than or equal to 2 | S1 |

| Form a common electrode layer and a patterned mask in sequence above the substrate, the patterned mask has openings each corresponding to one sub-unit region; where for each unit region, a hole ratio of at least one opening for the unit region is different from hole ratios of other n-1 number of openings for the unit region, and the hole ratio of the opening is a ratio value of an area of the opening to an area of the sub-unit region projected on the patterned mask corresponding to the opening | S2' |

| Form a first semiconductor layer, a light emitting layer and a second semiconductor layer in sequence above the common electrode layer exposed by respective openings, where a conductivity type of the second semiconductor layer is opposite to a conductivity type of the first semiconductor layer | S3' |

FIG. 11

METHOD OF MANUFACTURING A SEMICONDUCTOR STRUCTURE, WHICH CAN BE APPLIED TO FULL-COLOR LED

CROSS-REFERENCE TO RELATED APPLICATIONS

This application is a U.S. National Phase of PCT Application No. PCT/CN2020/116789 (filed 22 Sep. 2020), the entire contents of which are incorporated herein by reference.

TECHNICAL FIELD

The present disclosure relates to the field of semiconductor technology, in particular to methods of manufacturing a semiconductor structure.

BACKGROUND

Light emitting diode (LED) can emit visible light by recombining electrons and holes therein. Two main application fields of LED include: lighting and display. Especially in the display field, future development trends include: higher image quality and higher definition (more pixels and smaller size pixels). The key technology to realize high-definition display is to realize ultra-small light emitting pixels, which requires smaller-sized full-color LED light emitting units (light emitting cells).

In the related art, at present, a size of a full-color LED packaging unit is 1 mm*1 mm, and three formal LED chips with red color, green color, and blue color, are packaged on a printed circuit board (PCB) through a die bond and wire bond process, and electrodes of the three chips are leaded from the back of the PCB through conductive through-hole process to form a full-color LED packaging unit. The full-color LED packaging unit is then pressure-welded to the COB (chip on board) plate through COB packaging process, and a dot matrix LED display is formed through row wirings and column wirings on the COB plate. The size of the full-color LED packaging unit and the dot-matrix LED display is relatively large.

SUMMARY

The purpose of the present disclosure is to provide a method of manufacturing a semiconductor structure.

In order to achieve the above-mentioned purpose, the method of manufacturing the semiconductor structure provided by the present disclosure includes:
  providing a substrate, where a surface of the substrate includes unit regions, each of the unit regions includes n number of sub-unit regions, and n is a positive integer greater than or equal to 2;
  providing a patterned mask above the substrate, where the patterned mask has openings each corresponding to one of the sub-unit regions; where for each of the unit regions, a hole ratio of at least one opening for the unit region is different from hole ratios of other (n−1) number of openings for the unit region, and the hole ratio of the opening is a ratio value of an area of the opening to an area of the sub-unit region projected on the patterned mask corresponding to the opening; and
  growing a first semiconductor layer, a light emitting layer and a second semiconductor layer in sequence above the substrate exposed by the respective openings, where a conductive type of the second semiconductor layer is opposite to a conductive type of the first semiconductor layer.

In some embodiments, the manufacturing method further includes: forming a common electrode layer between the substrate and the patterned mask; and forming the first semiconductor layer, the light emitting layer and the second semiconductor layer in sequence above the common electrode layer exposed by the respective openings.

In some embodiments, the hole ratios of the n number of openings for the n number of sub-unit regions in the unit region are all different.

In some embodiments, areas of respective n number of sub-unit regions in the unit region are the same, and in the n number of openings for respective n number of sub-unit regions, there is at least one opening with an area different from areas of the other (n−1) number of openings.

In some embodiments, an arrangement of 2n number of openings for two adjacent unit regions is presented as mirror-symmetrical.

In some embodiments, in the n number of sub-unit regions of the unit region, there is at least one sub-unit region with an area different from areas of the other (n−1) sub-unit regions, and areas of the n number of openings for the respective n number of sub-unit regions are the same.

In some embodiments, an arrangement of 2n number of sub-unit regions for two adjacent unit regions is presented as mirror-symmetrical.

In some embodiments, a shape of the sub-unit region includes one of a rectangle, a circle, a triangle, a hexagon or a trapezoid.

In some embodiments, a shape of the opening includes one of a rectangle, a circle, a triangle, a hexagon or a trapezoid.

In some embodiments, the patterned mask is a patterned mask layer remaining in the semiconductor structure or a reusable cover mask plate.

In some embodiments, the light emitting layer includes a single quantum well layer or a multiple quantum well layer.

In some embodiments, a material of the first semiconductor layer is a group III nitride, and/or a material of the light emitting layer is a group III nitride, and/or a material of the second semiconductor layer is a group III nitride.

In some embodiments, the light emitting layer is doped with indium (In) element, and the hole ratio of the opening is adjusted to adjust composition proportion of the indium element in the light emitting layer in the opening.

BRIEF DESCRIPTION OF THE DRAWINGS

FIG. 7 to FIG. 10 are schematic views of intermediate structures corresponding to a method of manufacturing a semiconductor structure according to a second embodiment of the present disclosure.

FIG. 11 is a flowchart of a method of manufacturing a semiconductor structure according to a third embodiment of the present disclosure.

Figure 1:
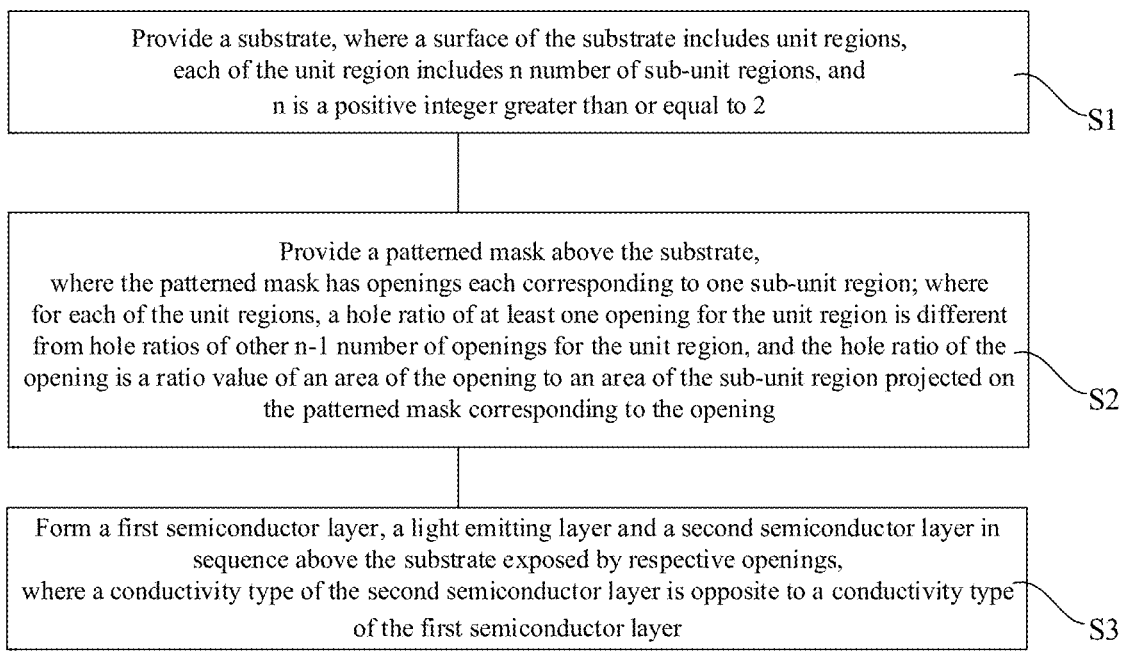
FIG. 1 is a flowchart of a method of manufacturing a semiconductor structure according to a first embodiment of the present disclosure.

To facilitate the understanding of the present disclosure, all reference signs present in the present disclosure are listed below:

| | |
|---|---|
| Substrate 10 | Unit region 11 |
| Sub-unit region 11a | Patterned mask 12 |
| Patterned mask layer 121 | Cover mask plate 122 |
| Opening 12a | Area S1 of a sub-unit region |
| Area S2 of an opening | Area S3 of a sub-unit region projected on the patterned mask |
| First semiconductor layer 13 | Light emitting layer 14 |
| Second semiconductor layer 15 | Common electrode layer 16 |

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a flowchart of a method of manufacturing a semiconductor structure according to a first embodiment of the present disclosure; and FIG. 2 to FIG. 6 are schematic views illustrating intermediate structures corresponding to the processes of FIG. 1.

Figure 2:
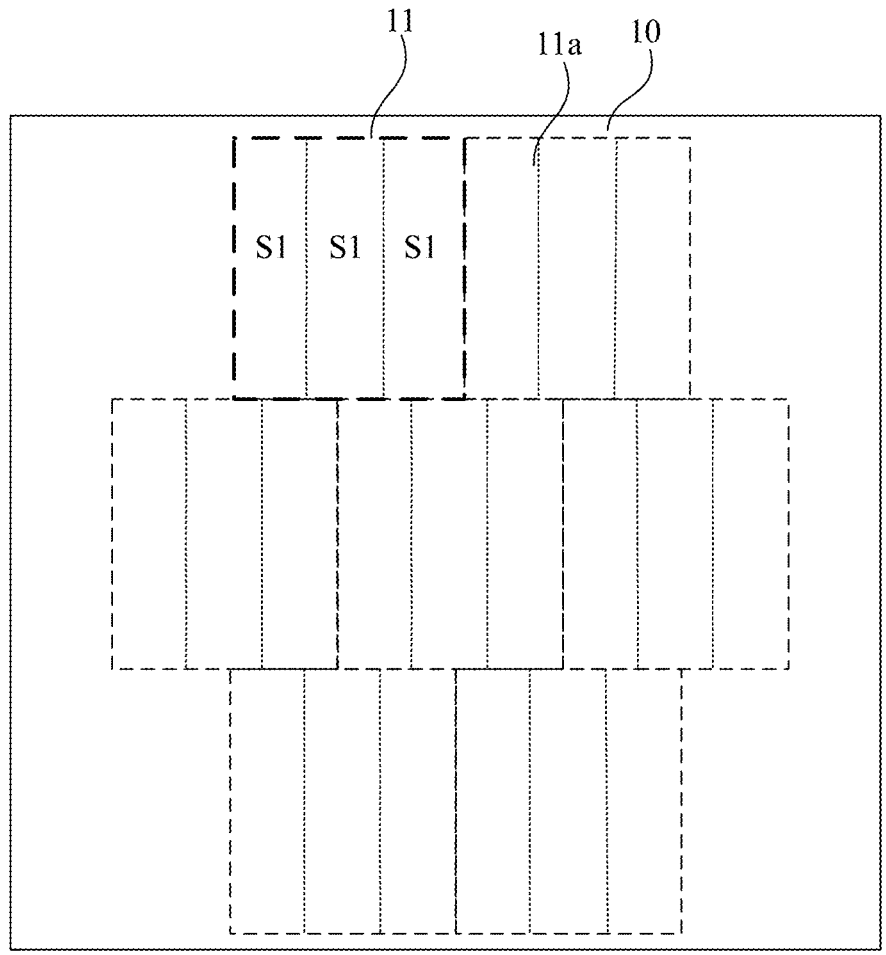
FIG. 2 to FIG. 6 are schematic views illustrating intermediate structures corresponding to processes of FIG. 1.

First, referring to step S1 in FIG. 1 and FIG. 2, a substrate 10 is provided. A surface of the substrate 10 includes unit regions 11, each unit region 11 includes n number of sub-unit regions 11a, and n is a positive integer greater than or equal to 2.

A material of the substrate 10 can include material such as sapphire, silicon carbide, silicon, GaN, AlN or diamond and so on.

In this embodiment, the semiconductor structure is applied to display, the unit regions 11 are arranged in an array, one unit region 11 corresponds to one pixel unit region, and one sub-unit region 11a corresponds to one sub-pixel region.

In other embodiments, the semiconductor structure can also be applied to illumination. The unit regions 11 are arranged in an array, one unit region 11 corresponds to one lighting unit region, and one sub-unit region 11a corresponds to one light emitting structure region with one primary color.

In the embodiment shown in FIG. 2, n can be 3, which corresponds to an LED light-emitting structure with three primary colors of red, green, and blue.

In some embodiments, n can also be 4, which corresponds to an LED light-emitting structure with four primary colors of red, green, blue, and yellow.

In the embodiment shown in FIG. 2, areas S1 of respective sub-unit regions 11a have the same size.

In this embodiment, shapes of respective sub-unit regions 11a are the same, and are all rectangular. In other embodiments, the shapes of respective sub-unit regions 11a can be different, and/or the shape of the sub-unit region 11a can also be one of a circle, a triangle, a hexagon, or a trapezoid. In this embodiment, the arrangements, shapes and sizes of respective sub-unit regions 11a are not limited.

Figure 3:
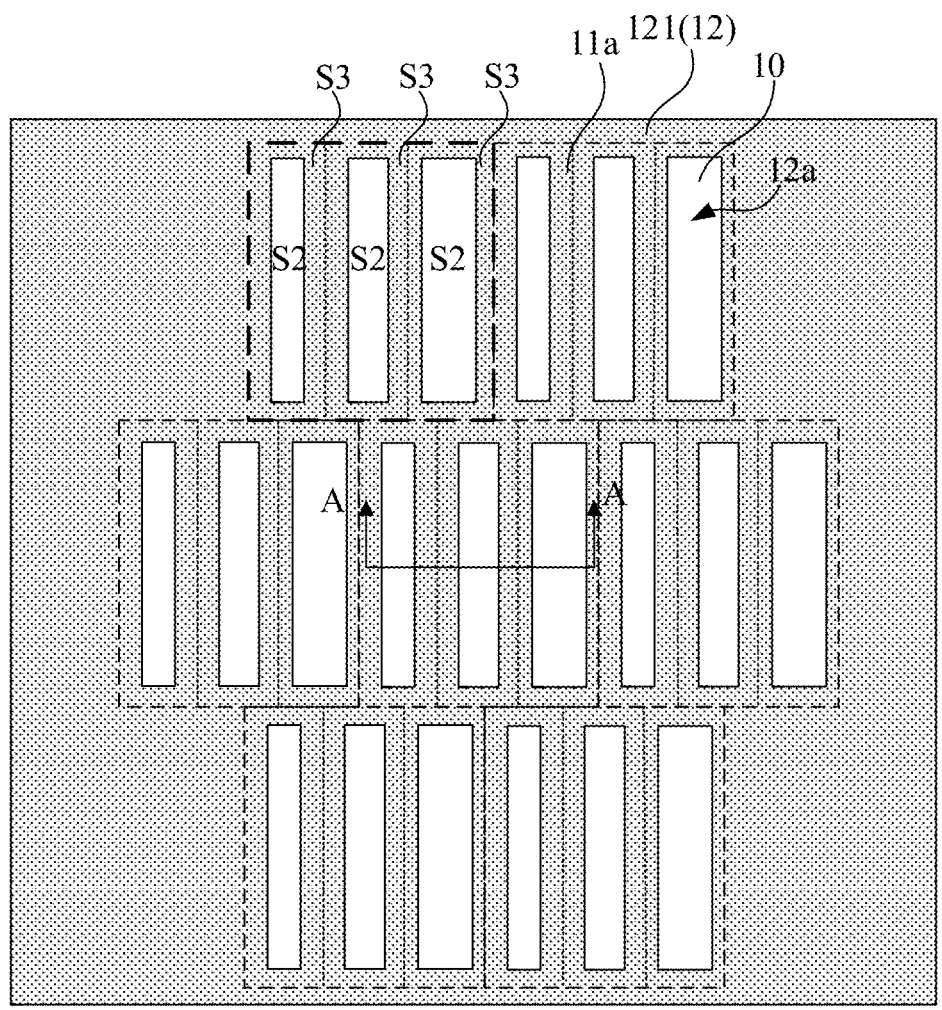
Figure 4:
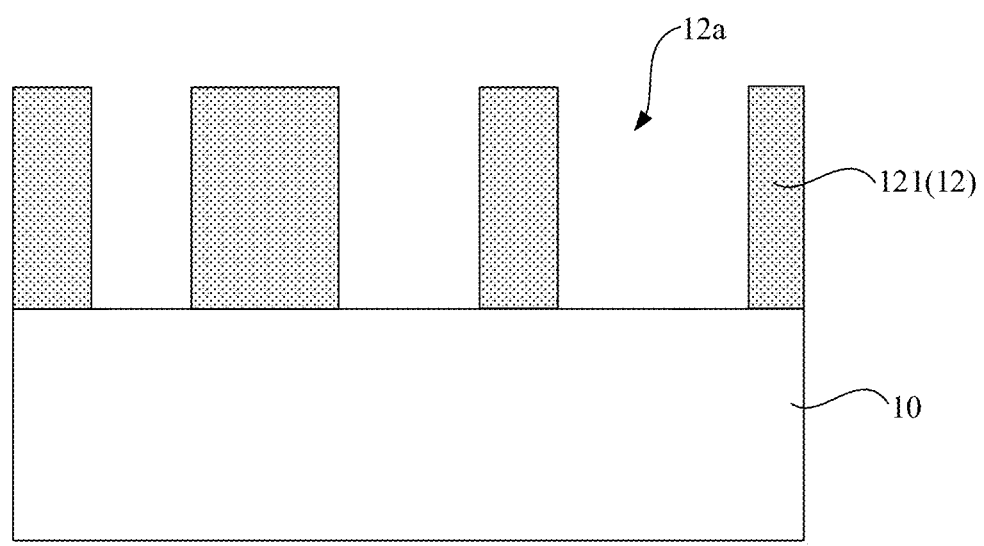

Next, referring to step S2 in FIG. 1, and FIG. 3 and FIG. 4, FIG. 4 is a cross-sectional view along line AA in FIG. 3, a patterned mask 12 is provided above the substrate 10. The patterned mask 12 has openings 12a each corresponding to one sub-unit region 11a; and for each of the unit region 11, a hole ratio of at least one opening 12a for the unit region 11 is different from hole ratios of other (n−1) number of openings 12a for the unit region 11. The hole ratio of the opening 12a is a ratio value of an area S2 of the opening 12a to an area S3 of the sub-unit region 11a projected on the patterned mask 12 corresponding to the opening 12a.

In this embodiment, the patterned mask 12 is a patterned mask layer 121. A material of the mask layer 121 can include, for example, at least one of silicon dioxide or silicon nitride. The mask layer 121 can be formed by physical vapor deposition or chemical vapor deposition, and patterning can be achieved by dry etching or wet etching.

In this embodiment, as shown in FIG. 2, areas S1 of the three sub-unit regions 11a in each unit region 11 have the same size, such that areas S3 of the three sub-unit regions 11a projected on the patterned mask 12 have the same size. Referring to FIG. 3, areas S2 of the three openings 12a for the three sub-unit regions 11a are different from each other, such that hole ratios of the three openings 12a are different.

In some embodiments, if one unit region 11 includes n number of sub-unit regions 11a, the areas of respective sub-unit regions 11a are the same; in the n number of openings 12a for the n number of sub-unit regions 11a, there can be at least one opening 12a with an area different from areas of the other (n−1) number of openings 12a.

In this embodiment, respective openings 12a have the same shape and are rectangular. In other embodiments, the shapes of respective openings 12a can be different, and/or the shape of the opening 12a can also be one of a circle, a triangle, a hexagon, or a trapezoid.

Figure 5:
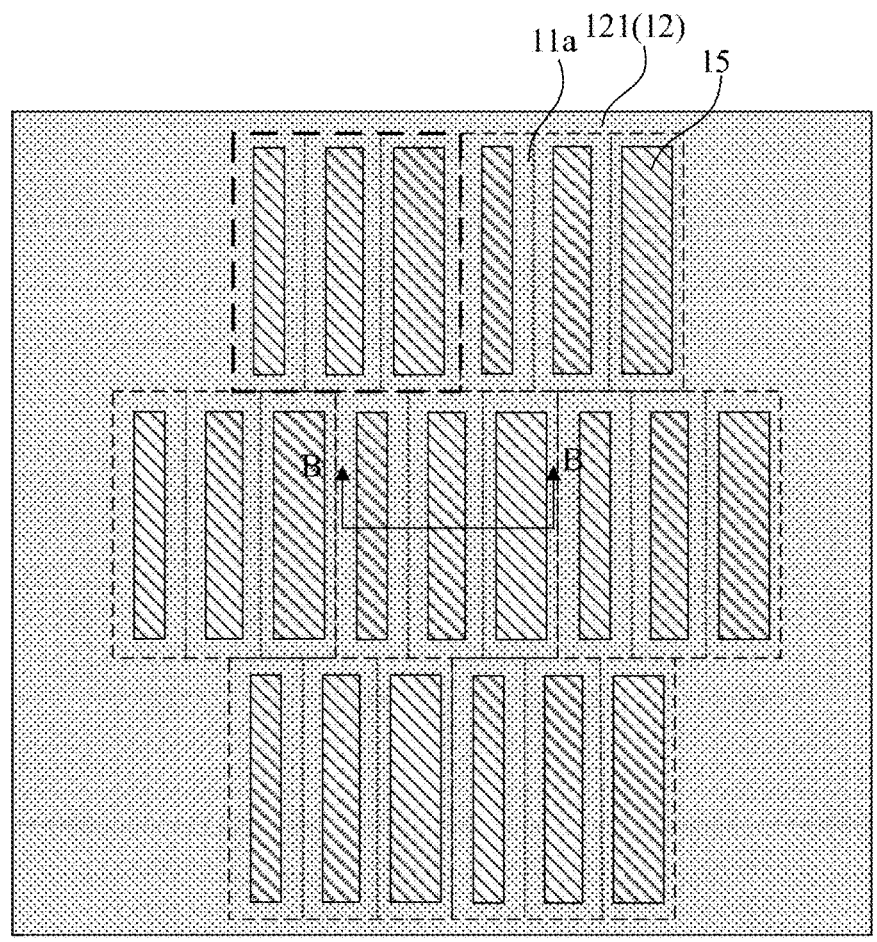
Figure 6:
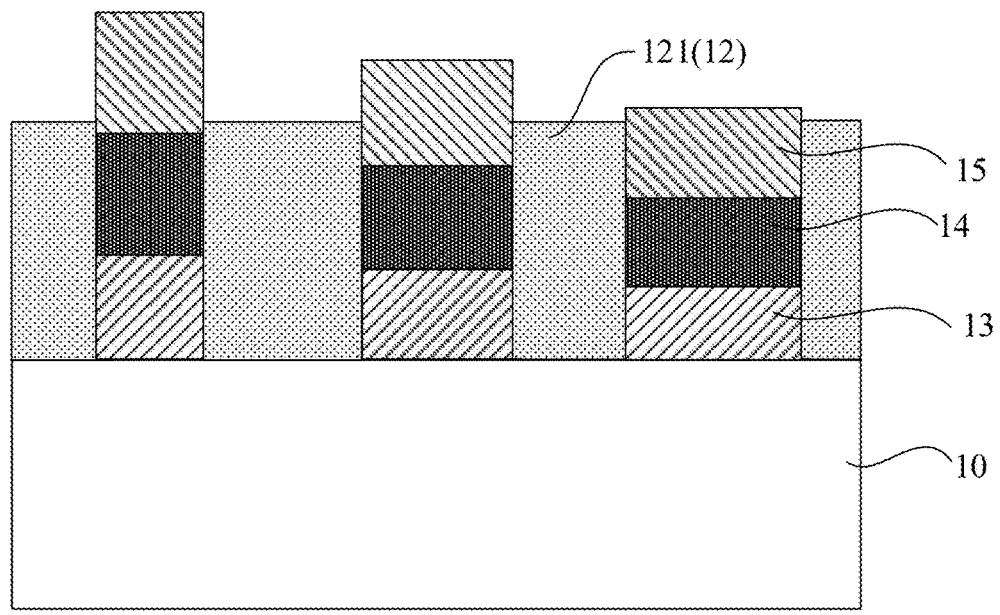

After that, referring to step S3 in FIG. 1, and FIG. 5 and FIG. 6, FIG. 6 is a cross-sectional view along line BB in FIG. 5, a first semiconductor layer 13, a light emitting layer 14 and a second semiconductor layer 15 are sequentially formed above the substrate 10 exposed by respective openings 12a, and a conductivity type of the second semiconductor layer 15 is opposite to a conductivity type of the first semiconductor layer 13.

A material of the first semiconductor layer 13 can include a group III nitride, and can include at least one of GaN or AlGaN.

It should be noted that, in this embodiment, a certain material is represented by a chemical element, but molar ratios of respective chemical elements in the material are not limited. For example, GaN material includes gallium (Ga) element and nitrogen (N) element, but a molar ratio between gallium element and nitrogen element is not limited; AlGaN material includes three elements, that is, aluminum (Al) element, gallium (Ga) element, and nitrogen (N) element, but the molar ratios of the aluminum element, gallium element, and nitrogen element are not limited.

A type of the first semiconductor layer 13 can be P-type, and P-type doping ions can include at least one of magnesium (Mg) ions, zinc (Zn) ions, calcium (Ca) ions, strontium (Sr) ions or barium (Ba) ions.

Formation process of forming the group III nitride can include: Atomic Layer Deposition (ALD), or Chemical Vapor Deposition (CVD), or molecular beam epitaxial (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

P-type ions doping can be achieved by in-situ doping (in-situ) process.

The light emitting layer 14 can include at least one of a single quantum well structure, a multiple quantum well (MQW) structure, a quantum wire structure, or a quantum dot structure. The light emitting layer 14 can include a well layer and a barrier layer. A band gap width of the well layer is smaller than that of the barrier layer.

A material of the light emitting layer 14 can include a GaN-based material, and indium (In) element can be doped therein, for example, InGaN; or aluminum (Al) element can be doped therein, for example, AlGaN. A band gap width of InN is about 0.7 eV, which is narrow than a band gap width of GaN, which is 3.4 eV. Therefore, the greater the doping amount of indium element is, the longer the light emitting wavelength of the light emitting layer 14 is. The band gap width of AlN is about 6.2 eV, which is wider than a band gap width of GaN, which is 3.4 eV. Therefore, the greater the doping amount of aluminum element is, the shorter the light emitting wavelength of the light emitting layer 14 is.

Growth processes of the GaN-based material containing indium element or aluminum element can refer to the growth process of the aforementioned group III nitride material.

The openings 12a in the mask 12 have different hole ratios, and flow rates of reactive gases used for growing the light emitting layer 14 in the openings 12a are different, such that the doping rates of indium/aluminum elements and gallium element are different, that is, the doping efficiencies of indium/aluminum elements are different, which makes the composition proportion of indium/aluminum elements in the grown light emitting layer 14 different. In some embodiments, the smaller the hole ratio of the opening 12a is, the faster the growth rate of the base material GaN of the light emitting layer 14 in the opening 12a is, and the doping of indium element has a better selectivity, the doping rate of indium element is higher than the doping rate of gallium element. Therefore, the smaller the hole ratio of the opening 12a is, the higher the composition content of indium element in the light emitting layer 14 InGaN is. In addition, the smaller the hole ratio in the opening 12a is, the higher the thickness of the quantum wells in the opening is. Because of the quantum Stark effect, the light emitting wavelength will be increased. Conversely, the larger the hole ratio of the opening 12a, the less obvious the difference between the doping rate of indium element and the doping rate of the gallium element is, that is, the lower the doping efficiency of indium element is, the lower the composition proportion of indium element in the grown light emitting layer 14 is.

In another embodiment, if the base material GaN of the light emitting layer 14 is doped with aluminum element, the smaller the hole ratio of the opening 12a is, the faster the growth rate of the base material GaN of the light emitting layer 14 in the opening 12a is, while the growth of the aluminum element does not have a selectivity, the doping rate of aluminum element is smaller than the doping rate of gallium element, therefore, the smaller the hole ratio of the opening 12a is, the lower the composition content of aluminum element in the light emitting layer 14 AlGaN is, such that the smaller the doping amount of aluminum is, the longer the light emitting wavelength of the light emitting layer 14 is.

In addition, the larger the hole ratio of the opening 12a is, the thinner the thickness of the grown light emitting layer 14 is; the smaller the hole ratio of the opening 12a is, the thicker the thickness of the grown light emitting layer 14 is, and the thickness of the quantum well will also increase accordingly. Because of the quantum Stark effect, the light emitting wavelength will be increased accordingly.

In the embodiment shown in FIG. 6, the thickness of the mask 12 is greater than a sum of a predetermined maximum thickness of the first semiconductor layer 13 and a predetermined maximum thickness of the light emitting layer 14, which can avoid the light emitting layers 14 of respective sub-unit regions 11a in one unit region 11 to be overlapped, thereby avoiding cross-color problems.

A material of the second semiconductor layer 15 can include a group III nitride, and can include at least one of GaN or AlGaN.

A type of the second semiconductor layer 15 be an N-type, and N-type doping ions can include at least one of Silicon (Si) ions, germanium (Ge) ions, tin (Sn) ions, selenium (Se) ions or tellurium (Te) ions.

The growth process of the N-type group III nitride material can refer to the aforementioned growth process of the P-type group III nitride material.

In some embodiments, the second semiconductor layer 15 can be attached on the patterned mask layer 121, and the second semiconductor layer 15 on the mask layer 121 can be removed by dry etching or wet etching, such that the second semiconductor layers 15 of respective sub-unit regions 11a in one unit region 11 are electrically insulated. In some embodiments, the second semiconductor layer 15 on the mask layer 12 of one unit region 11 may not be removed, such that the second semiconductor layers 15 of the respective sub-unit regions 11a in one unit region 11 are electrically connected together.

In some embodiments, the material of the mask layer 121 can be selected such that the second semiconductor layer 15 is difficult to attach to the patterned mask layer 121, such that the second semiconductor layers 15 of respective sub-unit regions 11a in one unit region 11 are electrically insulated.

In this embodiment, the patterned mask layer 121 remains in the semiconductor structure.

In some embodiments, the first semiconductor layer 13 can be an N-type semiconductor layer, and the second semiconductor layer 15 can be a P-type semiconductor layer.

The first semiconductor layer 13, the light emitting layer 14 and the second semiconductor layer 15 in each sub-unit region 11a form an LED structure. The LED structure of each unit region 11 forms an LED unit.

The first semiconductor layer 13 and the second semiconductor layer 15 are respectively applied with voltages to provide holes and electrons, the higher the composition proportion of indium element in the light emitting layer 14 is, the longer the light emitting wavelength is; the lower the composition proportion of indium element is, the shorter the light emitting wavelength is; the higher the composition proportion of aluminum element is, the shorter the light emitting wavelength is; the lower the composition proportion of aluminum element is, the longer light emitting wavelength is.

In the subsequent processes, a first electrode and a second electrode can also be manufactured to form the LED device; the first electrode electrically leads out the first semiconductor layer 13, and the second electrode electrically leads out the second semiconductor layer 15.

Figure 7:
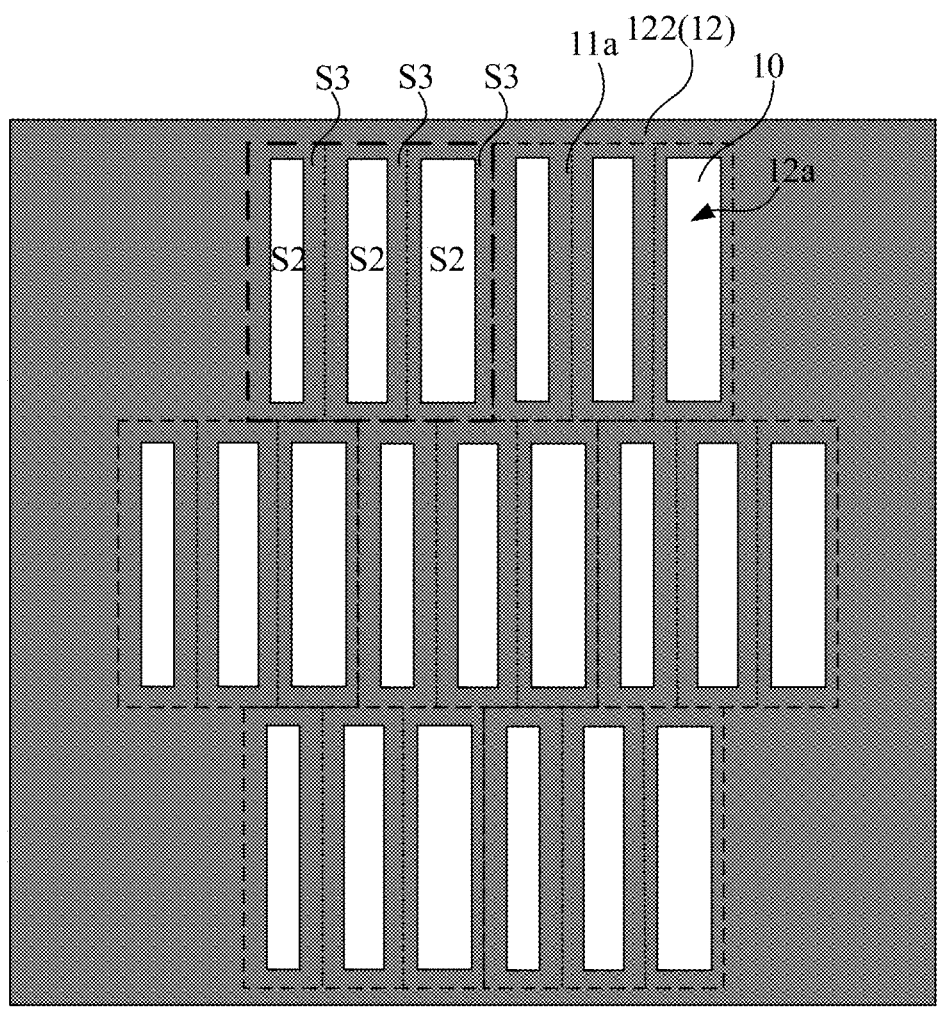
Figure 8:
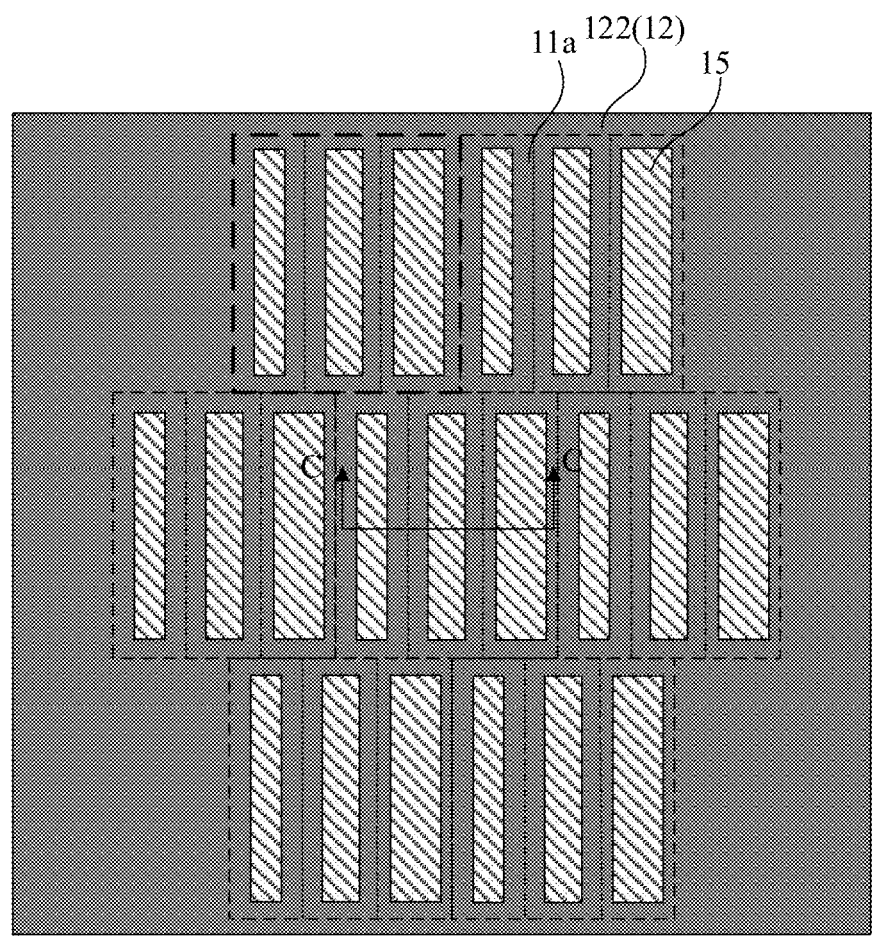
Figure 9:
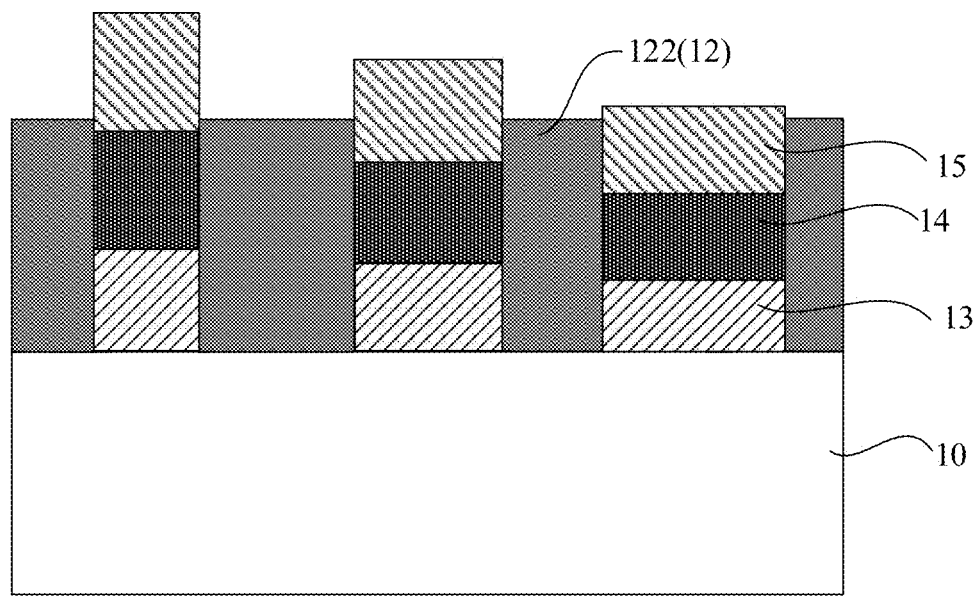

FIG. 7 to FIG. 10 are schematic views of intermediate structures corresponding to a method of manufacturing a semiconductor structure according to a second embodiment of the present disclosure, and FIG. 9 is a sectional view along a CC line in FIG. 8. Referring to FIG. 7 to FIG. 10, the method of manufacturing the semiconductor structure according to the second embodiment is substantially the same as the method of manufacturing the semiconductor structure according to the first embodiment, except that: as shown in FIG. 7, at step S2, the patterned mask 12 is a mask plate 122; correspondingly, as shown in FIG. 8 to FIG. 10, after step S3 is completed, the mask plate 122 can be peeled off from the substrate 10 and to be reused.

A thickness of the mask plate 122 can be greater than a sum of a predetermined maximum thickness of the first semiconductor layer 13 and a predetermined maximum thickness of the light emitting layer 14.

The mask plate 122 can be provided between adjacent sub-unit regions 11a, which can prevent the light emitting layers 14 of respective sub-unit regions 11a of one unit region 11 from overlapping, and avoid cross-color problems. In this case, the mask plate 122 can also be provided between adjacent unit regions 11, which can prevent cross-color problems between the adjacent unit regions 11.

FIG. 11 is a flowchart of a method of manufacturing a semiconductor structure according to a third embodiment of the present disclosure; FIG. 12 to FIG. 15 are schematic views illustrating intermediate structures corresponding to processes of FIG. 11; and FIG. 14 is a cross-sectional view along a DD line in FIG. 13.

Figure 12:
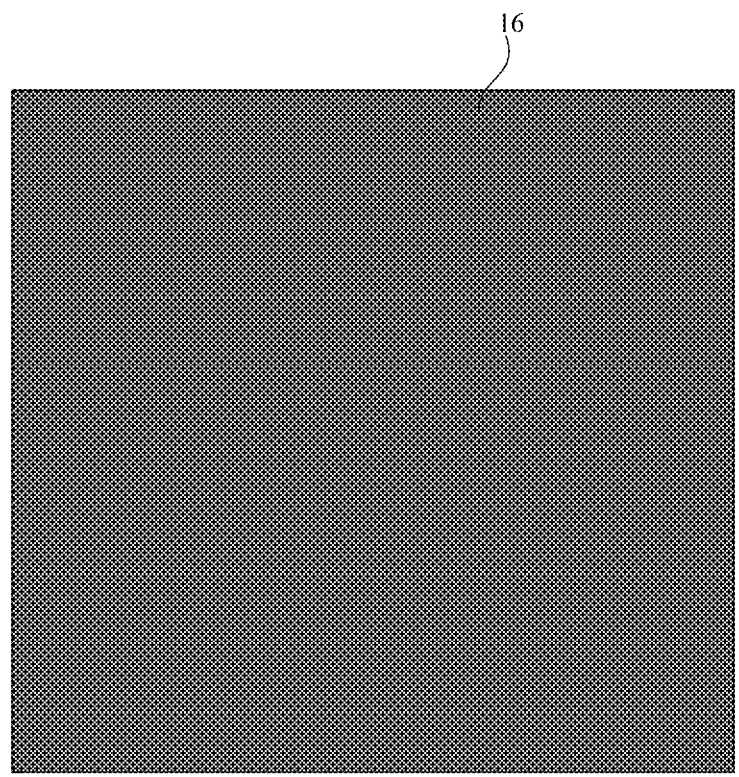
FIG. 12 to FIG. 15 are schematic views illustrating intermediate structures corresponding to processes of FIG. 11.
Figure 13:
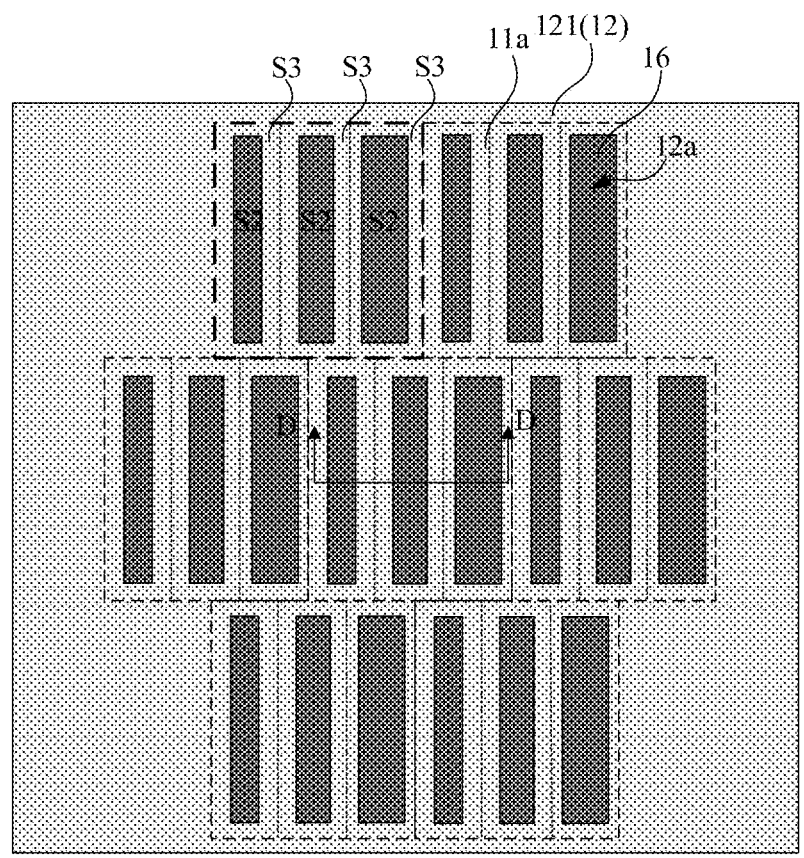
Figure 14:
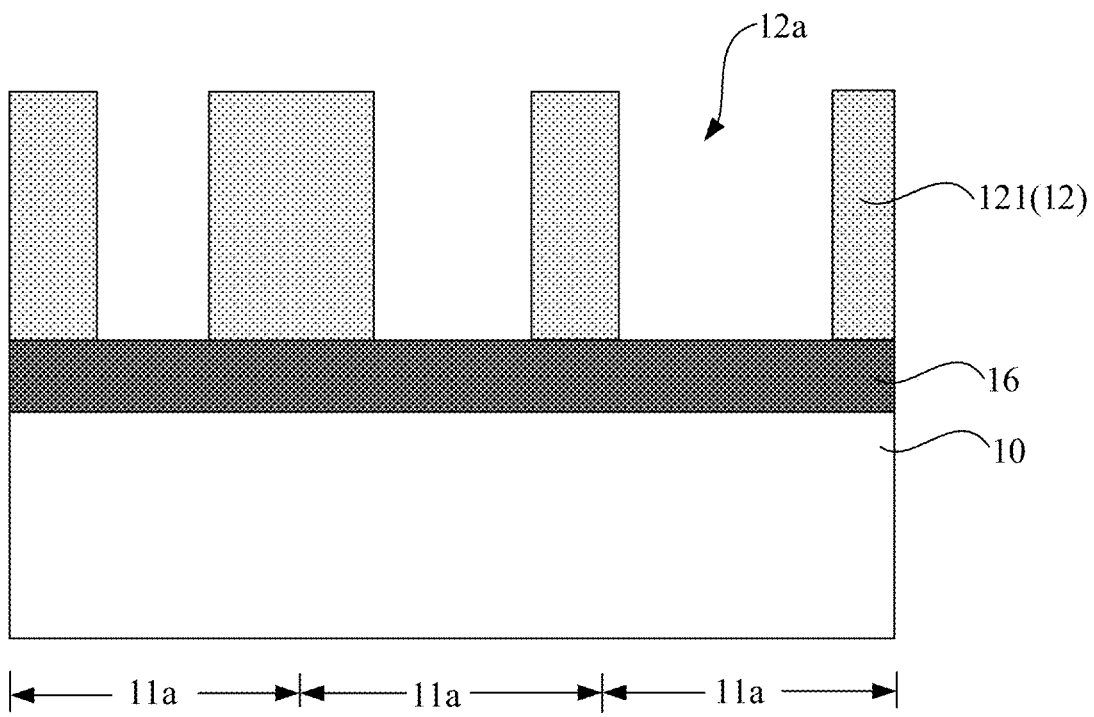

Referring to FIG. 11, the method of manufacturing the semiconductor structure according to the third embodiment is substantially the same as the method of manufacturing the semiconductor structure according to the first and second embodiments, except that:

at step S2', referring to FIG. 12 to FIG. 14, a common electrode layer 16 and a patterned mask 12 are sequentially formed above the substrate 10. In other words, the common electrode layer 16 is formed between the substrate 10 and the patterned mask 12. For the material of the common electrode layer 16 and the formation method thereof, reference can be made to the material of the first semiconductor layer 13 and the formation method thereof.

Figure 15:
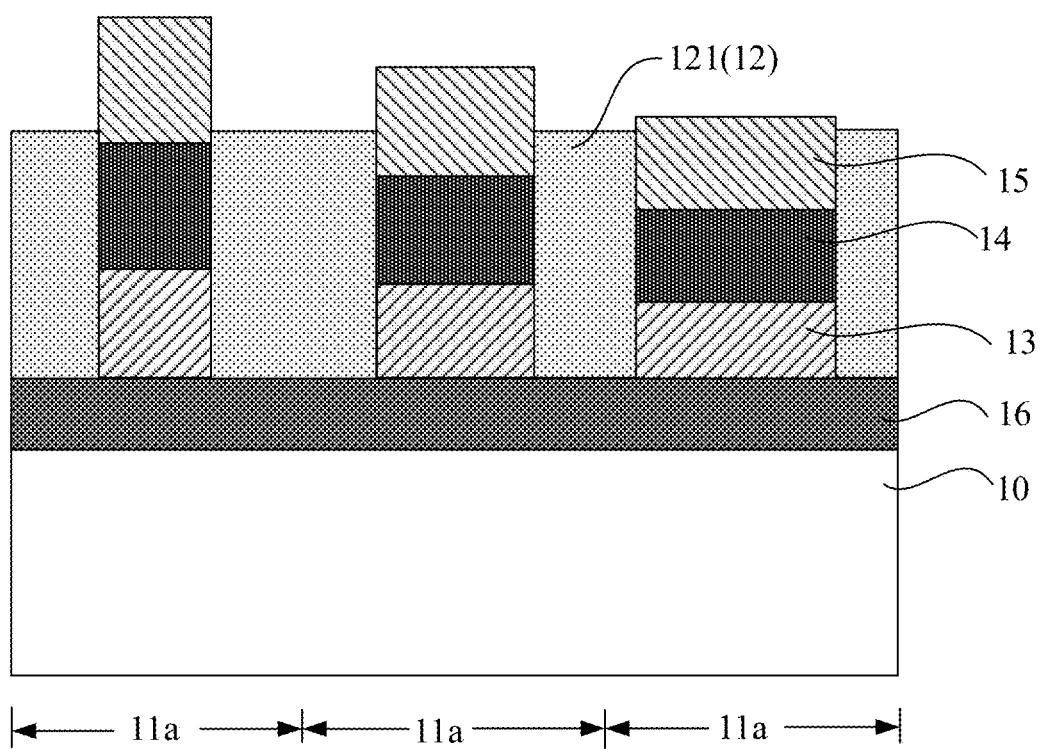

At step S3', referring to FIG. 15, the first semiconductor layer 13, the light emitting layer 14 and the second semiconductor layer 15 are sequentially formed above the common electrode layer 16 exposed by the opening 12a.

The common electrode layer 16 is configured to electrically connect the first semiconductor layers 13 of respective sub-unit regions 11a in one unit region 11 and/or the first semiconductor layers 13 of respective unit region 11.

Figure 16:
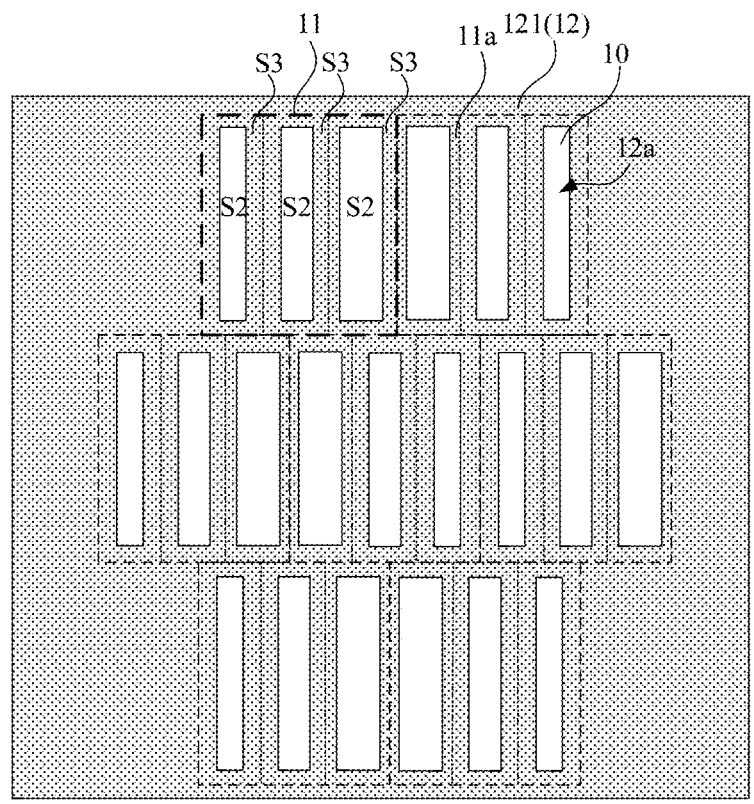
FIG. 16 is a schematic view of an intermediate structure corresponding to a method of manufacturing a semiconductor structure according to a fourth embodiment of the present disclosure.

FIG. 16 is a schematic view of an intermediate structure corresponding to the method of manufacturing semiconductor substrate according to the fourth embodiment of the present invention.

Referring to FIG. 16, the method of manufacturing the semiconductor structure according to the fourth embodiment is substantially the same as the method of manufacturing the semiconductor structure according to the first, second, and third embodiments, except that: an arrangement of 2n number of openings 12a for two adjacent unit regions 11 is presented as a mirror-symmetrical.

Compared with the arrangement of the openings 12a in FIG. 3, the advantage of the mirror-symmetrical arrangement of the present embodiment is that: the openings 12a with close hole ratios are close to each other, which can stabilize a flow rate of the reactive gas, stabilize the doping efficiency of indium/aluminum elements, and stabilize the component proportions of indium/aluminum elements in the growing light emitting layer 14.

Figure 17:
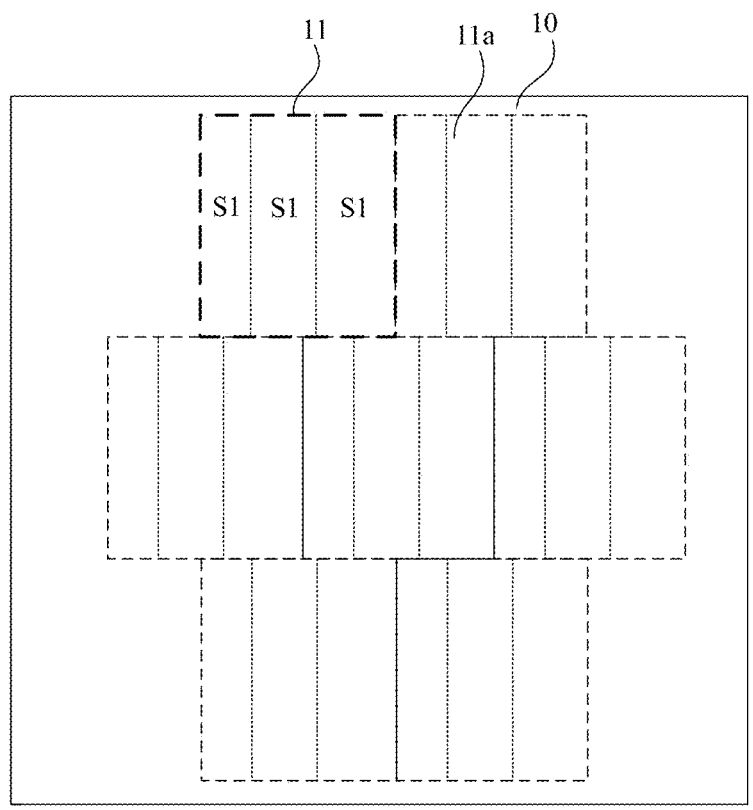
FIG. 17 to FIG. 20 are schematic views of intermediate structures corresponding to a method of manufacturing a semiconductor structure according to a fifth embodiment of the present disclosure.
Figure 18:
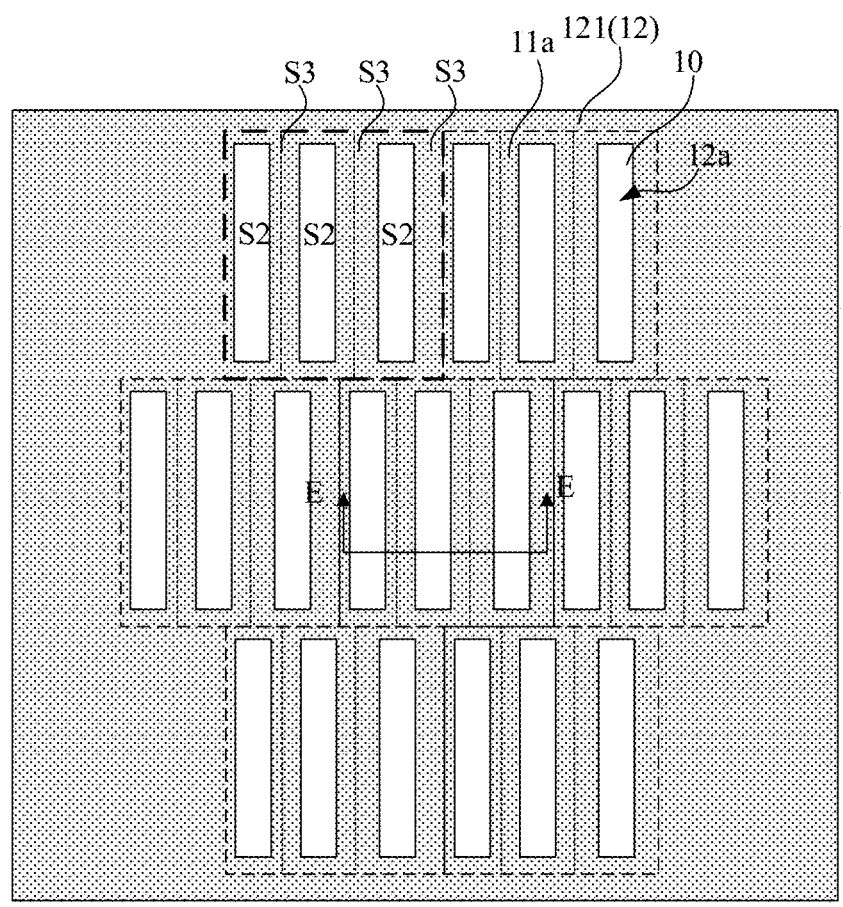
Figure 19:
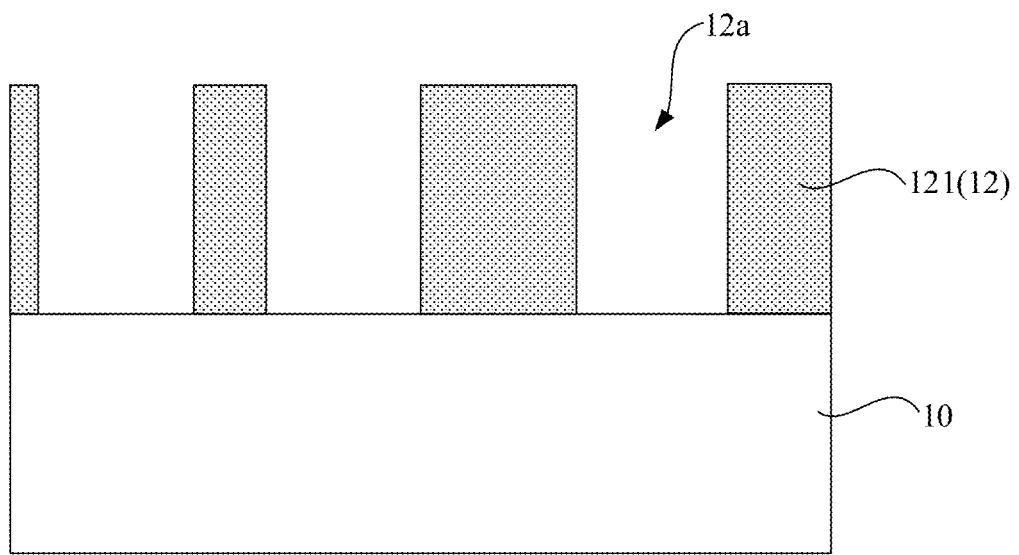

FIG. 17 to FIG. 20 are schematic views of intermediate structures corresponding to the method of manufacturing the semiconductor structure according to a fifth embodiment of the present disclosure; and FIG. 19 is a cross-sectional view along an EE line in FIG. 18. Referring to FIG. 17 to FIG. 20, the method of manufacturing the semiconductor structure according to the fourth embodiment is substantially the same as the method of manufacturing the semiconductor structure according to the first, second, and third embodiments, except that:

at step S1, referring to FIG. 17, in one unit region 11, the areas S1 of respective sub-unit regions 11a are different in size;

at step S2, referring to FIG. 18 and FIG. 19, in the patterned mask 12, the areas S2 of the openings 12a for respective sub-unit regions 11a are the same; due to the areas S1 of respective sub-unit regions 11a in each unit region 11 have different sizes, the areas S3 of respective sub-unit regions 11a projected on the patterned mask 12 are different, thus, the hole ratios of respective openings 12a are different.

Figure 20:
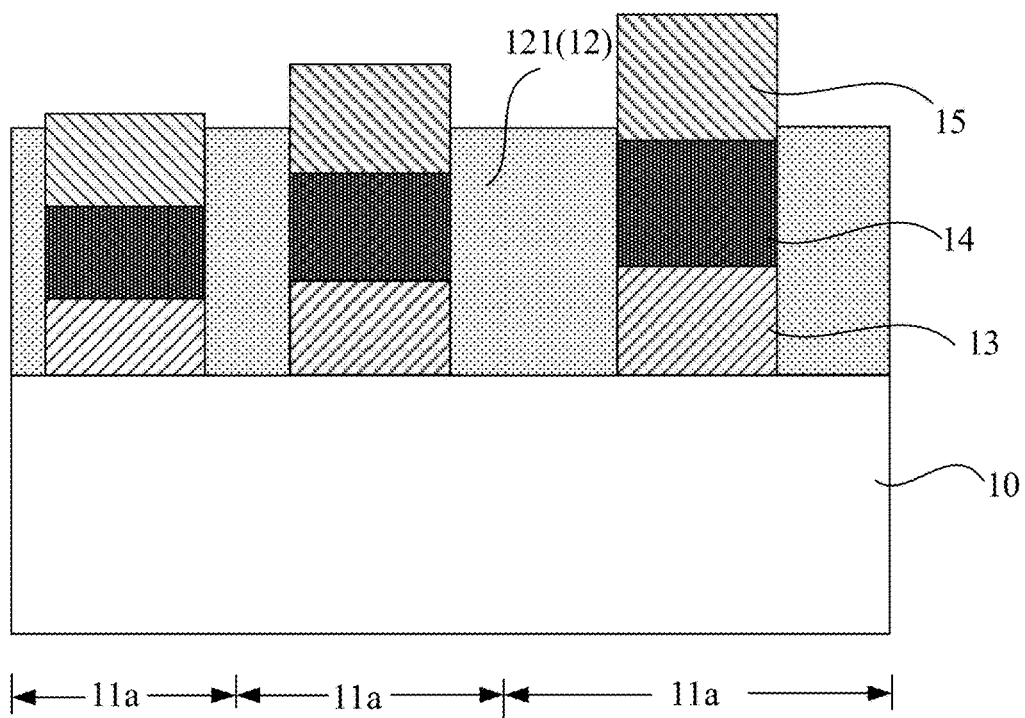

Referring to FIG. 20, the openings 12a of the mask 12 have different hole ratios, and the composition proportions of indium/aluminum elements in the light emitting layer 14 grown at step S3 are different, and the light emitting wavelengths are different.

Figure 21:
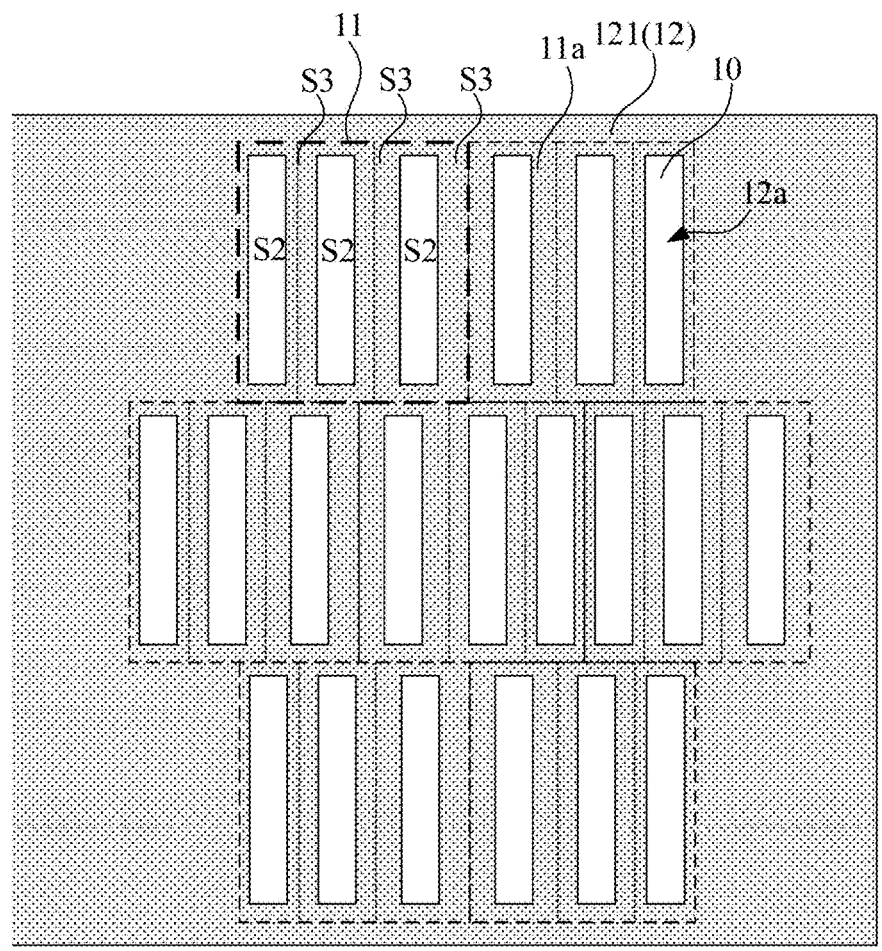
FIG. 21 is a schematic view of an intermediate structure corresponding to a method of manufacturing a semiconductor structure according to a sixth embodiment of the present disclosure.

FIG. 21 is a schematic view of an intermediate structure corresponding to a method of manufacturing a semiconductor structure according to a sixth embodiment of the present disclosure.

Referring to FIG. 21, the method of manufacturing the semiconductor structure according to the sixth embodiment is substantially the same as the method of manufacturing the semiconductor structure according to the fifth embodiment, except that: an arrangement of 2n number of sub-unit regions 11a in two adjacent unit regions 11 is presented as mirror-symmetrical.

Compared with the arrangement of the n number of sub-unit regions 11a in FIG. 18, the advantage of the mirror-symmetrical arrangement of the present embodiment is that: the openings 12a with close hole ratios are close to each other, which can stabilize a flow rate of the reactive gas, stabilize the doping efficiency of indium/aluminum elements, and stabilize the component proportions of indium/aluminum elements in the growing light emitting layer 14.

Compared with the related art, the present disclosure has the following beneficial effects:

because openings in the mask for one unit region of the substrate have different hole ratios, flow rates of reactive gas in respective openings are different when growing the light emitting layer, and due to growth rates of the light emitting layer in respective openings are different, doping efficiencies of the light emitting layers in respective openings are different, such that composition proportions of respective elements in the grown light emitting layers are different, and the light emitting wavelengths of LED are different. The above-mentioned processes are simple, and the semiconductor structure for full-color LED can be manufactured on one substrate, which can reduce a size and cost of the full-color LED.

Although the present disclosure discloses the above contents, the present disclosure is not limited thereto. Any one of ordinary skill in the art can make various variants and modifications to the present disclosure without departing from the spirit and scope of the present disclosure. Therefore, the protection scope of the present disclosure should be set forth by the appended claims.

The invention claimed is:

1. A method of manufacturing a semiconductor structure, comprising:
providing a substrate, wherein a surface of the substrate comprises unit regions, each of the unit regions comprises n number of sub-unit regions, and n is a positive integer greater than or equal to 2;
forming a patterned mask above the substrate, wherein the patterned mask has openings each corresponding to one of the sub-unit regions; wherein for each of the unit regions, a hole ratio of at least one opening for the unit region is different from hole ratios of other (n−1) number of openings for the unit region, and the hole ratio of the opening is a ratio value of an area of the opening to an area of the sub-unit region projected on the patterned mask corresponding to the opening; and
forming a first semiconductor layer, a light emitting layer and a second semiconductor layer in sequence above the substrate exposed by the respective openings, wherein a conductive type of the second semiconductor layer is opposite to a conductive type of the first semiconductor layer;
wherein the light emitting layer is doped with an aluminum element, and the hole ratio of the opening is adjusted to adjust a composition proportion of the aluminum element in the light emitting layer in the opening, in which as the hole ratio of the opening decreases, a composition content of the aluminum element in the light emitting layer also decreases.

2. The method of manufacturing the semiconductor structure according to claim 1, further comprising:
forming a common electrode layer between the substrate and the patterned mask; and
forming the first semiconductor layer, the light emitting layer and the second semiconductor layer in sequence above the common electrode layer exposed by the respective openings.

3. The method of manufacturing the semiconductor structure according to claim 1, wherein each of the n number of sub-unit regions of one of the unit regions have a same area; and an area of at least one opening in n number of openings corresponding to the n number of sub-unit regions is different from areas of other (n−1) openings in the n number of openings corresponding to the n number of sub-unit regions.

4. The method of manufacturing the semiconductor structure according to claim 3, wherein an arrangement of 2n number of openings for two adjacent unit regions is presented as mirror symmetric.

5. The method of manufacturing the semiconductor structure according to claim 1, wherein an area of at least one sub-unit region in the n number of sub-unit regions of one of the unit regions is different from areas of other (n−1) number of sub-unit regions in the n number of sub-unit regions of the one of the unit regions; and an area of each of n number of openings for the n number of sub-unit regions is same.

6. The method of manufacturing the semiconductor structure according to claim 5, wherein an arrangement of 2n number of sub-unit regions for two adjacent unit regions is presented as mirror symmetric.

7. The method of manufacturing the semiconductor structure according to claim 1, wherein a shape of the sub-unit region-comprises one of a rectangle, a circle, a triangle, a hexagon or a trapezoid.

8. The method of manufacturing the semiconductor structure according to claim 1, wherein a shape of the opening comprises one of a rectangle, a circle, a triangle, a hexagon or a trapezoid.

9. The method of manufacturing the semiconductor structure according to claim 1, wherein the patterned mask is a patterned mask layer remaining in the semiconductor structure or a reusable mask plate.

10. The method of manufacturing the semiconductor structure according to claim 1, wherein the light-emitting layer comprises a single quantum well layer or a multiple quantum well layer.

11. The method of manufacturing the semiconductor structure according to claim 1, wherein at least one of:
a material of the first semiconductor layer is a group III nitride;
a material of the light emitting layer is a group III nitride; or
a material of the second semiconductor layer is a group III nitride.

12. The method of manufacturing the semiconductor structure according to claim 1, wherein the light emitting layer is doped with indium element, and a hole ratio of the opening is adjusted to adjust a composition proportion of indium element in the light emitting layer in the opening.

13. The method of manufacturing the semiconductor structure according to claim 1, wherein the light emitting layer comprises a well layer and a barrier layer, and a band gap width of the well layer is smaller than a band gap width of the barrier layer.

14. The method of manufacturing the semiconductor structure according to claim 1, wherein a thickness of the patterned mask is greater than a sum of a predetermined maximum thickness of the first semiconductor layer and a predetermined maximum thickness of the light emitting layer.

15. The method of manufacturing the semiconductor structure according to claim 1, further comprising: removing the second semiconductor layer on the patterned mask, such that the second semiconductor layers of respective sub-unit regions in one unit region are electrically insulated.

16. The method of manufacturing the semiconductor structure according to claim 1, further comprising: not removing the second semiconductor layer on the patterned mask of one unit region, such that the second semiconductor layers of the respective sub-unit regions in one unit region are electrically connected together.

17. The method of manufacturing the semiconductor structure according to claim 1, further comprising: providing a mask plate between adjacent sub-unit regions.

18. The method of manufacturing the semiconductor structure according to claim 1, further comprising: providing a mask plate between adjacent unit regions.

19. The method of manufacturing the semiconductor structure according to claim 1, wherein the larger the hole ratio of the opening is, the thinner the thickness of the grown light emitting layer is; and the smaller the hole ratio of the opening is, the thicker the thickness of the grown light emitting layer is.

* * * * *